United States Patent [19]

Stopper et al.

[11] Patent Number: 4,458,297
[45] Date of Patent: Jul. 3, 1984

[54] UNIVERSAL INTERCONNECTION SUBSTRATE

[75] Inventors: Herbert Stopper, Orchard Lake; Richard A. Flasch, Rochester, both of Mich.

[73] Assignees: Mosaic Systems, Inc., Del.; Burroughs Corporation, Mich.

[21] Appl. No.: 445,156

[22] Filed: Nov. 29, 1982

Related U.S. Application Data

[63] Continuation of Ser. No. 225,581, Jan. 16, 1981, abandoned.

[51] Int. Cl.³ ............................................. H05K 1/18
[52] U.S. Cl. ................................... 361/403; 174/68.5; 357/2; 357/45; 361/410; 361/416
[58] Field of Search ...................... 361/410, 416, 403; 357/2, 45; 174/68.5

[56] References Cited

U.S. PATENT DOCUMENTS

| | | | |
|---|---|---|---|
| 3,312,871 | 4/1967 | Seki et al. ...................... | 361/410 X |
| 3,445,823 | 5/1969 | Petersen ......................... | 365/163 X |
| 3,558,992 | 1/1971 | Huener et al. ................... | 317/101 |
| 3,777,221 | 12/1973 | Tatsuko ............................. | 361/416 |
| 3,803,483 | 4/1974 | McMahon ........................ | 324/51 |
| 3,981,070 | 9/1976 | Buelow et al. .................... | 29/574 |
| 4,234,888 | 11/1980 | Calhoun ............................ | 357/45 |
| 4,295,182 | 10/1981 | Aubusson et al. ............. | 324/73 R X |
| 4,364,044 | 12/1982 | Kusano ........................... | 361/416 X |

*Primary Examiner*—R. R. Kucia
*Attorney, Agent, or Firm*—Lynn L. Augspurger

[57] ABSTRACT

Disclosed is a wafer substrate for integrated circuits (1) which by itself may be made either of conductive or non-conductive material. This substrate carries two planes or layers of patterned metal (19, 20), thus providing two principal levels of interconnection. An insulation layer (21) is placed between the metal layers and also between the lower metal layer and the substrate if the latter is conductive. Connections between the metal layers or between the metal layer and the substrate can be made through via holes in the insulator layer or layers, respectively.

The real estate provided by the substrate (1) is divided up into special areas used for inner cells (2) outer cells (3) signal hookup areas (4) and power hookup areas (5). The cells are intended to host the integrated circuit chips (24, 25) and to provide the bonding pads (8) for the signal connections between the chips and the substrate.

20 Claims, 12 Drawing Figures

UNIVERSAL INTERCONNECTION SUBSTRATE

This is a continuation of application Ser. No. 225,381, filed Jan. 16, 1981 now abandoned.

BACKGROUND OF THE INVENTION

This invention relates to hybrid integrated circuits, which are comprised of an interconnection substrate and integrated circuit chips which are mounted on that substrate, and more particularly to a new universal substrate which can be used to interconnect any desired set of chips by any possibly desired wiring diagram.

An integrated circuit is manufactured together with many other similar circuits within a thin slice or wafer of silicon. The final process step applied to wafer manufacture is to saw or break the wafer into individual circuits or chips. Each chip carries a set of bonding pads through which the chip must be connected to other chips and to the outside world. This can either be done by placing each chip into an individual package, wherein a connection is made between each bonding pad and a corresponding package lead and where further external connections are made between package leads, or by placing chips on a substrate whereon interconnections are made from each chip bonding pad to a corresponding substrate bonding pad and where further interconnections between substrate bonding pads are provided by the substrate. The type of bond (wire, beam lead, gold bump, solder ball) is immaterial in the context of this invention. Wire bonding will be used in the following description of the invention for the purpose of explanation only. If the chips are bonded directly to an interconnection substrate, the whole assembly is called a hybrid circuit. This invention relates to using a silicon wafer similar to those used to make individual chips as a substrate for a hybrid circuit.

In the prior art, substrates, which are usually manufactured as multi-layered ceramic plates, provided a limited number of routing channels for the required chip interconnections. It took, therefore, a costly and time consuming automated and/or manual process to devise a suitable interconnection pattern. Furthermore, since most substrates in a system differ from each other, a separate set of tools was needed for the manufacture of each substrate type.

Accordingly, the primary object of this invention is to provide a universal substrate which can be programmed to provide any desired interconnection pattern between any set of chips which may be placed on that substrate.

Another object of the invention is to provide routing channels of such numbers and such properties that programming the interconnections can be done effectively and without extensive computer aided or manual layout work.

Still another object of this invention is that programming can be done similar to the known capabilities of ROM and PROM chips either by "mask programming" or by "electrical programming" of a completely finished substrate.

Still another object of this invention is to extend the electrical programming to electrical reprogramming so that logic design errors and/or substrate manufacturing defects can be corrected after the substrate has been finished.

SUMMARY OF THE INVENTION

The substrate which accomplishes the foregoing objects is a wafer made of silicon or any other material suitable for integrated circuit-type processing. Two layers of interconnection separated by a layer of insulation are deposited and patterned on this wafer. The resolution for patterning the metal on the wafer is such that the two layers of metal provide enough routing channels to interconnect all the chips which can physically be placed on the wafer. The actual routing is provided by a particular pattern of orthogonal lines with a special selection of fixed and programmable cross-points connecting certain lines to each other in such a manner that all possibly desired connections among substrate bonding pads and between substrate bonding pads and the outside world can be made. A fixed connection cross-point or a mask programmable cross-point is made by a via hole entered into the insulator between the metal lines crossing each other, while an electrically programmable connection cross-point is made by placing a pad of amorphous semiconductor material, which can be switched electrically from a high-impedance to a low-impedance state, between the metal lines crossing each other.

DESCRIPTION OF THE PREFERRED EMBODIMENT

Turning now to the drawings in greater detail, I will outline what is shown in each drawing, element by element, and then proceed in more detail.

FIG. 1 shows the master wafer in plan view, of which layers will be shown;

FIG. 2 is a plan view of the layer portions of the wafer of FIG. 1, showing pad lines;

FIG. 3 is a plan view of the layer portion of the wafer of FIG. 1 showing net lines;

FIG. 4 shows the layer portion of FIG. 1 for power distribution;

FIG. 5 shows a cell (2 in FIG. 1) in more detail;

FIG. 6 shows a layer of the cell of FIG. 5 showing bonding pads in detail;

FIG. 7 is a further detail of FIG. 5;

FIG. 8 shows a cross section of FIG. 5 through a cross-over between a pad line and a net line;

FIG. 9 is a diagramatic view of an interconnection between the pads;

FIG. 10 is a diagram of a cell (2) of FIG. 1 showing how smaller chips can be bonded in the cell position;

FIG. 11 is another diagram showing how to mix chips; and

FIG. 12 shows a strip layout.

BRIEF DESCRIPTION OF THE DRAWINGS

FIG. 7 shows a detail (13) as it may be found in FIG. 5. The narrow lines are pad lines 6 and 7, and the wide lines are net lines 9 and 10. Cross-overs between pad lines are insulated. Cross-overs between net lines are generally also insulated except that each horizontal net line is connected through a via hole (16) at one point to a vertical net line. Cross-overs between pad lines and net lines have a via hole (17) cut into the insulator between the metal layers and have a pad of amorphous semiconductor (18) sandwiched in between.

Figure 1:
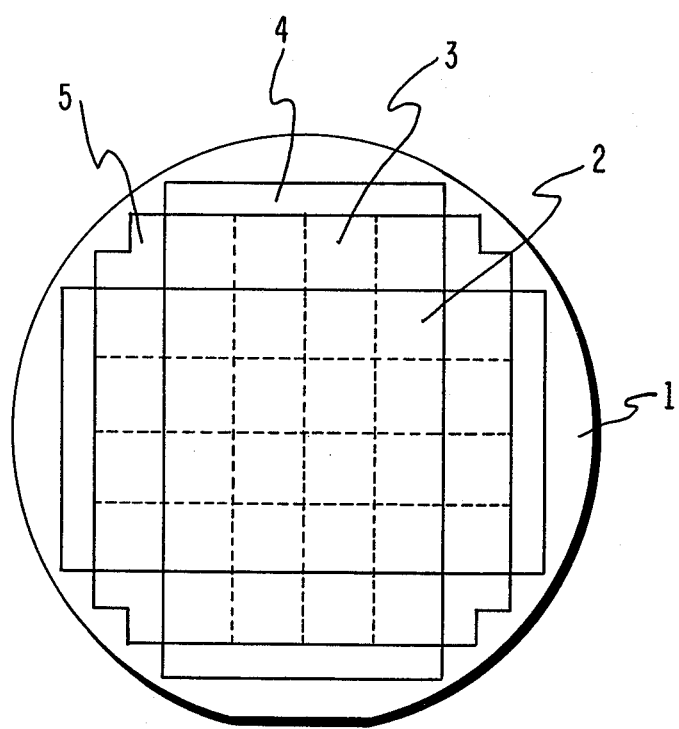
FIG. 1 is a plan view of a wafer (1) showing how the available area may be divided up into innercells (2), and outer cells (3), logic line hookup areas (4), and power hookup areas (5).

From the above, it will be seen that the drawings disclose a substrate (1) which by itself may be made either of conductive or non-conductive material. This substrate carries two planes or layers of patterned metal (19, 20), thus providing two principal levels of interconnection. An insulation layer (21) is placed between the metal layers and also between the lower metal layer and the substrate if the latter is conductive. Connections between the metal layers or between the metal layer and the substrate can be made through via holes in the insulator layer or layers, respectively.

The real estate provided by the substrate (1) is divided up into special areas used for inner cells (2) outer cells (3) signal hookup areas (4) and power hookup areas (5). In one preferred embodiment, the substrate may be a disk with a diameter of 75 mm, the cells may be squares with edges of 9 mm, the signal hookup areas may be rectangles with sides of 4.5 mm and 36 mm, and the power hookup areas may fill out the remaining space at the "corners."

Figure 6:
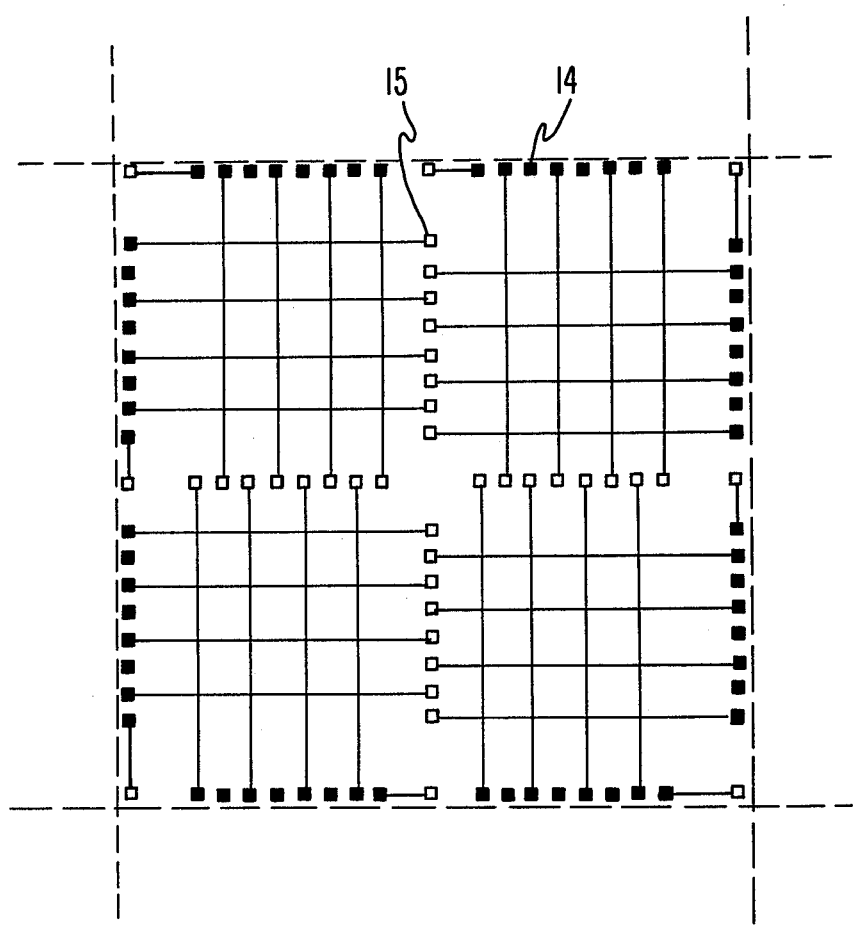
FIG. 6 shows that a cell contains main bonding pads (14) and auxiliary bonding pads (15). Only main pads command their own pad lines as shown in FIG. 2. An auxiliary pad is connected to a next neighbor main pad.
Figure 10:
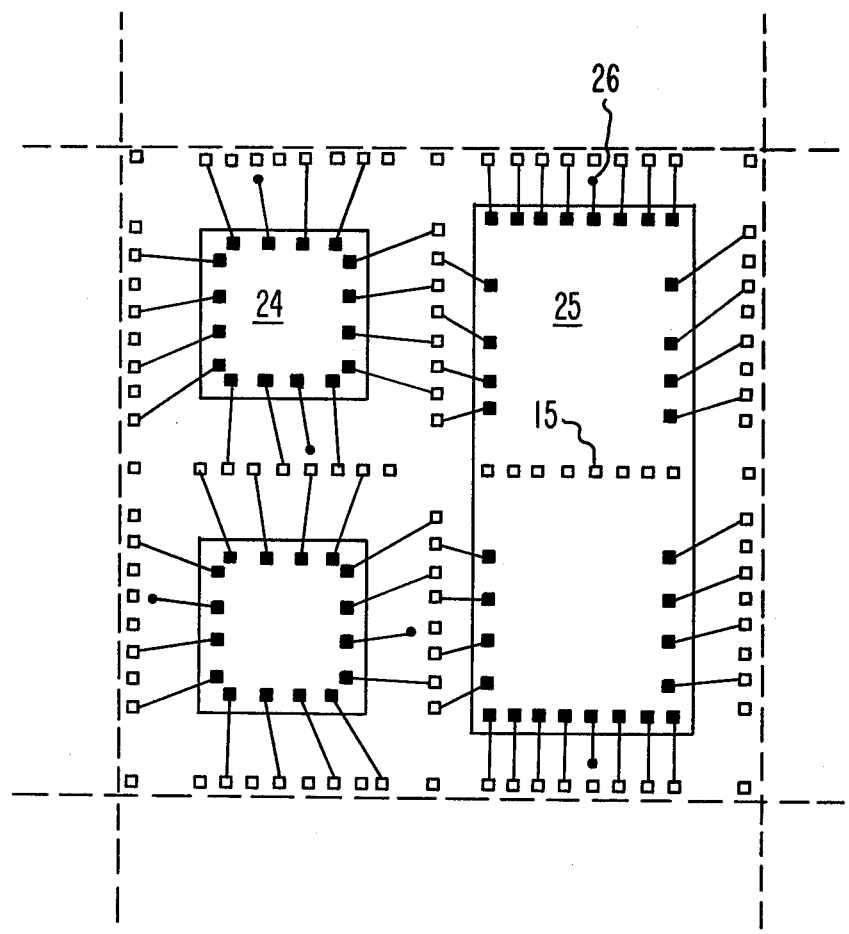
FIG. 10 shows how smaller chips (24 & 25) which require less area and a smaller number of pads then provided by a cell can be accommodated efficiently. Some unused pads (15) are buried under the chip. Power connections (26) are made directly to one of the power rails and not to a pad (8).
Figure 11:
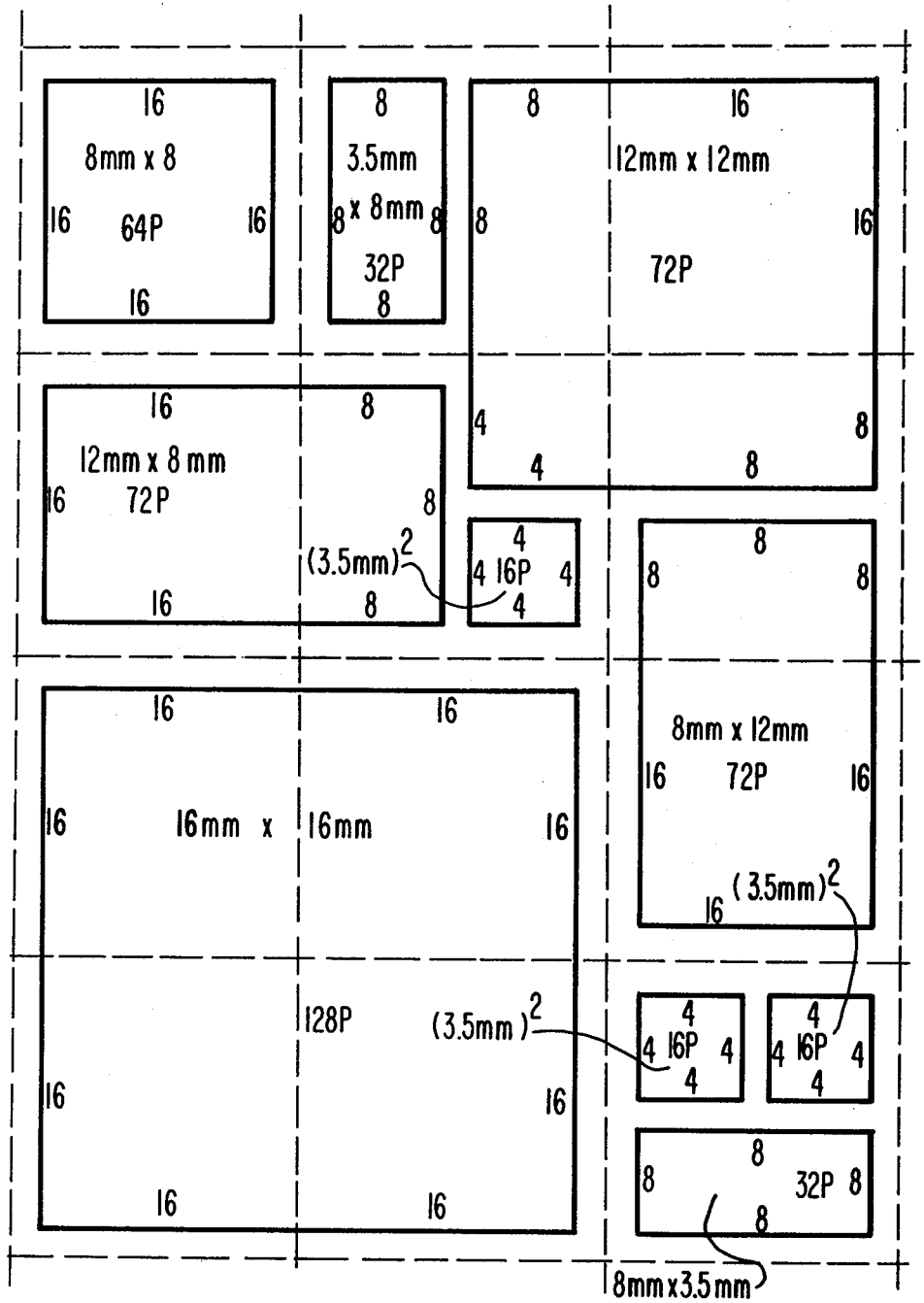
FIG. 11 shows how a mixture of chips which require larger, equal, and smaller areas than provided by a cell can be accommodated. The numbers within the chip symbols indicate maximum size and available logic signal pads.

The cells are intended to host the integrated circuit chips (24, 25) and to provide the bonding pads (8) for the signal connections between the chips and the substrate. In the preferred embodiment, the inner cells provide sixty-four signal pads each so that LSI chips with up to sixty-four leads and with a physical size of up to 8 mm by 8 mm can be accommodated. Chips which are substantially smaller than the possible maximum in terms of physical size and signal leads can share a cell as shown by example in FIG. 10. Since bond wires cannot jump over a neighbor chip to find a substrate bonding pad, auxiliary pads (15) are provided which are connected with the main pads (14) through the substrate (FIG. 6). Over-size chips which are either larger than 8 mm by 8 mm or which require more than sixty-four bonding pads can be stretched over 2 or more cells or any quadrants thereof. FIG. 11 shows some examples. The maximum chip size and number of available bonding pads is inscribed within the outline of a chip. It is also possible that bonding pads can be borrowed from another cell or quarter cell along the common edge between 2 cells. Since some pads will be buried under the chips, the back of the chips is insulated from these pads by suitable means as, for instance, chip bonding with non-conductive epoxy. All in all, it can be seen that the substrate can be universally used for any combination of chip sizes.

Some chips, particularly dynamic MOS RAM chips, have the unique characteristic that their aspect ratio is approximately 2:1 and that the chip bonding pads are located along the 2 smaller sides of the chip. Such chips can be accommodated more economically by reduced cells which provide bonding pad only in one direction. Such cells are shown in the preferred embodiment as outer cells. They are derived from complete cells by omitting either the horizontal or the vertical rows of bonding pads. RAM chips would be placed into an outer cell-like chip (25) shown in FIG. 10 except that all vertical pad columns on the chip as well as on the substrate would have been eliminated.

Power supply connections have been separated from logic signal connections because they must provide lower series resistance. Since it is not known in advance where the power inputs of a particular chip may be located, it is not possible to assign power pads on the substrate. This problem has been solved by providing 2 power buses (11) along the edges and along the center lines of all cells. A chip power pad which may be located anywhere along the edge of the chip can now be connected to a power bus instead of a substrate pad with a bond (26).

Figure 4:
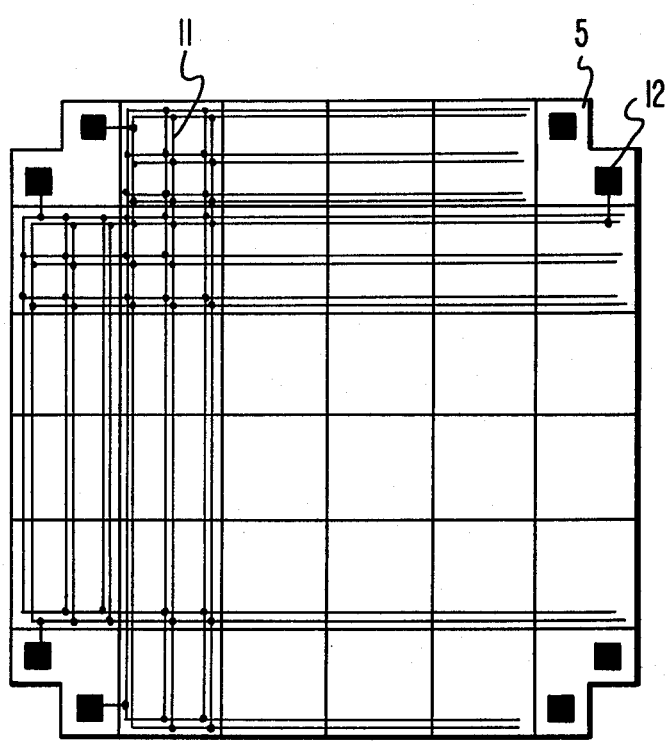
FIG. 4 shows a power grid (11) for a two rail power distribution system. Each cell is crossed by both rails three times in both the horizontal and vertical directions. The power rails are connected to a pair of contact pads (12) in each power hookup area (5).

The power buses form a power grid over the entire substrate as shown in FIG. 4. The width of a power bus may be 350 $\mu$m. If implemented with 1 $\mu$m-thick aluminum, which yields a sheet resistivity of 30 m$\Omega$/□, the longitudinal resistance would amount to 86 m$\Omega$/mm. If the actual loads are known, the voltage drops in the power system can be computed accordingly. For a general approximation, one can work with a "power sheet" instead of a "power grid", whereby the equivalent power sheet resistivity is derived from the actual sheet resistivity o by multiplying it with the ratio between cell width and bus width.

$$\rho = \frac{\text{cell width}}{\text{bus width}} \rho o = \frac{9 \text{ mm}}{3 * 0.35 \text{ mm}} * 30 \text{ m}\Omega/\square = 257 \text{ m}\Omega/\square$$

If a disk with the radius R is loaded over its entire surface with a current density j, and if the periphery of the disk is held at ground potential, then the point with the highest potential is found at the center of the disk and the voltage U between the center and the periphery is found to be $$U = \frac{\rho j R^2}{4}$$

p $\rho=0.257\Omega$, 2R=75 mm, and j=Io/(9 mm)$^2$ yields U=1.12$\Omega$*Io. Thus, for a load of 1 amp per cell, the voltage drop from the power hookup to the center of the wafer would be approximately 1 volt.

One has now to consider two basic types of circuits: "symmetrical circuits" as, for instance, CMOS and "unsymmetrical circuits" as, for instance, NMOS. For symmetrical circuits, which have a threshold centered between the power rails, the power grid as described so far is adequate. The supply voltages at the substrate edge may be 0 and +5 volts. The threshold would then be set by a chip-internal voltage divider to approximately 2.5 volts. A chip at the center would see voltage drops of approximately 1 volt at each power rail, i.e., the power input voltages would be +1 and +4 volts. The threshold of the circuit at the center would again be halfway between the power rails, i.e., at +2.5 volts so that all circuits on the wafer could properly communicate with each other.

In unsymmetrical circuits, all thresholds are referenced to one of the power rails (usually ground) and more or less independant from the other power rail. In this case, the voltage drop along the reference rail must be relatively small. This can be accomplished by using a solid ground sheet under the two metal layers discussed above and by making via connections between the ground grid and this sheet at several points per cell. If the ground sheet is comprised of a conductive silicon wafer with an additional layer of 2 $\mu$m-thick aluminum a sheet resistivity of 10 m$\Omega/\square$ may be accomplished. Based on the same formula used above, the maximum voltage drop can be estimated to be U=0.04$\Omega$*Io or approximately 0.04 volts for cell currents of 1 amp each. This value is acceptable for most circuits.

Figure 2:
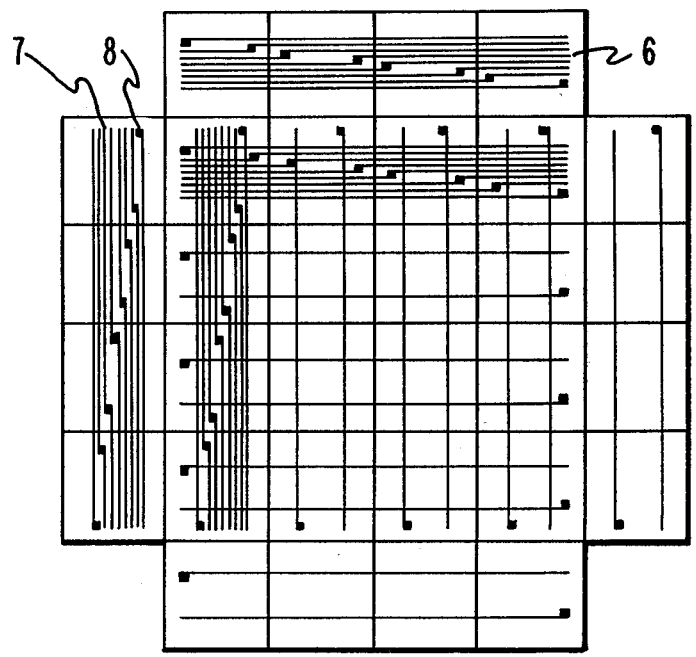
FIG. 2 shows horizontal pad lines (6) and vertical pad lines (7) crossing a number of cells in such a way that each pad (8) can be connected to its own pad line. Outer cells are crossed by either horizontal or vertical pad lines. Inner cells are crossed by both horizontal and vertical pad lines.

The next problem to be solved by this invention is to interconnect all substrate pads with each other in any possibly desired way and also to connect any or all pads to the outside world. This is accomplished by a set of pad lines (6, 7) and a set of net lines (9, 10). A pad line is permanently connected to exactly one pad (8). Thus, there are as many pad lines on the substrate as there are pads, whose number is 16*64+16*32=1,536 in the preferred embodiment. A pad line is routed either horizontally or vertically across the substrate for a certain distance. As can be seen in FIG. 2, the principal wiring pattern is such that, if a horizontal set of pad lines serves n columns of pads, there must be (n−1) pad lines passing between two pads of one and the same column.

Net lines are also routed either horizontally or vertically across the substrate. One horizontal net line (9) and one vertical net line (10) are permanently connected to each other, thus forming a net. Each net is connected to one contact pad (27) in one of the hookup areas (4). One preferred embodiment of the invention provides a total of 288 nets. Since the hookup areas are 36 mm long, the resulting contact pitch is 0.5 mm. Another preferred embodiment provides 432 nets, causing a 0.33 mm pitch for the peripheral contacts (27).

Figure 3:
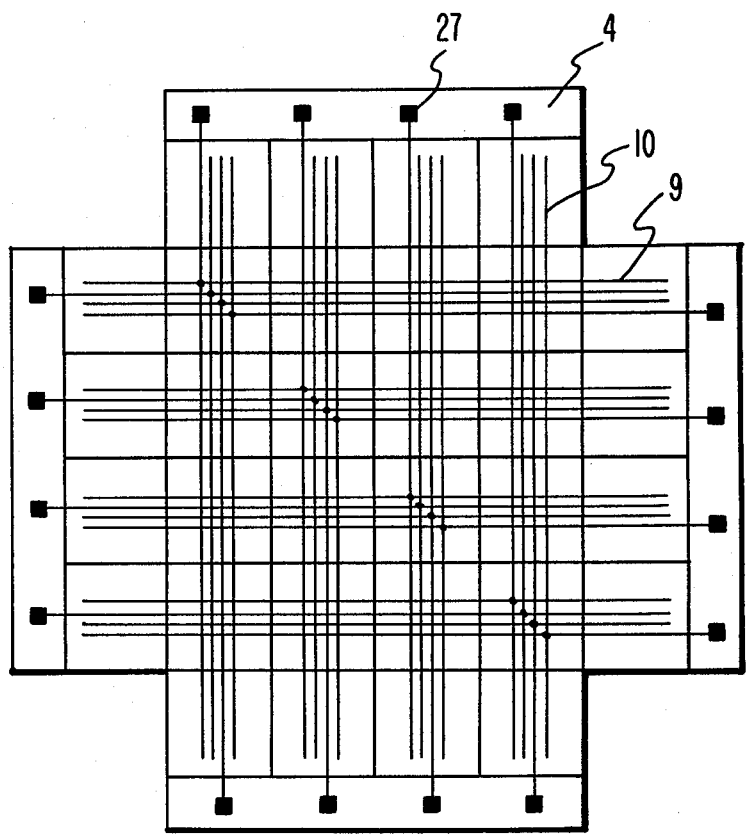
FIG. 3 shows horizontal net lines (9) and vertical net lines (10) which cross all cells in such a way that each horizontal pad line (6) is crossed by each vertical net line (10) and each vertical pad line (7) by each horizontal net line (9). Each horizontal net line (9) is connected permanently to exactly one vertical net line (10) and to exactly one contact pad (27) in one of the hookup areas (4). Thus, all pad lines cross all nets and all nets can be externally accessed.
Figure 9:
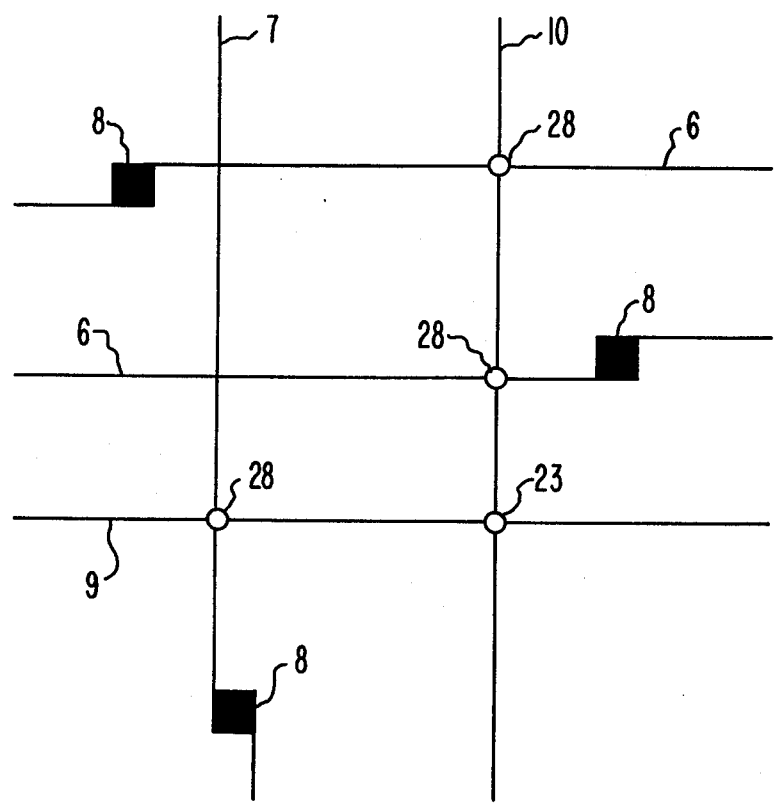
FIG. 9 shows how the desired interconnection between three pads (8) is made by selecting two orthogonal net lines (9 & 10) which are permanently connected to each other by via hole (23) and by firing the controllable cross-points (28) between the applicable pad lines (6 & 7) and the chosen net.

The combined routing pattern of pad lines and net lines is such that each pad line crosses each net exactly one time, which can be seen by combining FIG. 2 and FIG. 3. A number of pads can now be connected to each other by choosing a net and by making (programmable) connections at the cross-over points between this net and the respective pad lines (FIG. 9).

If one assumes that no more than 1,300 of the 1,536 available pads are actually used, the number of 288 nets would be adequate if the average fan-out is larger than 1,300/288−1=3.5. Accordingly, 432 nets would be adequate for an average fan-out of at least 2. Once an adequate number of nets have been chosen, one can truly say that all thinkable pad interconnection patterns can be derived from one standard set of lines.

In the preferred embodiment, the length of a pad line is 33 mm, and the length of a net line is approximately 42 mm (from one end to the farthest possible via). If the sheet resistivity of the metal is 30 m$\Omega/\square$, the longitudinal resistivity of a 10 $\mu$m wide pad line would be 3$\Omega$/mm and that of a 20 $\mu$m wide net line would be 1.5$\Omega$/mm.

The total resistance of a pad line amounts then to 100$\Omega$ and that of a net line to 63$\Omega$. The longest possible interconnection from, say, a pad in the upper left corner to a net line at the far right, then down to the net line at the bottom, then to the far left side, and finally up along another pad line to another pad in the upper left corner would amount to 326$\Omega$, a large value for a line between two pads which are located close to each other. An average connection would, of course, be much better. The best connection, however, is realized by choosing a net whose junction between its horizontal and vertical net lines is as close as possible to the pads which have to be tied together. It is, therefore, part of this invention to arrange the junctions (23) between the net lines not on a simple diagonal line as indicated for the small representative number of lines in FIG. 3, but rather in such a way that they are evenly distributed over the total field of inner cells. This provides a high probability that a net with a close-by junction can be found in all cases. The average connection length should thereby be reduced to about 1/5 of the maximum or to approximately 70$\Omega$.

The actual programming or firing of a cross-over between a pad line and a net line can be done in one or two ways, either by a normal via hole or by an electrically switchable link. The first method could be called "mask programming" as the term is applied in prior art to ROM chips. The disadvantage of this method is that a new via hole mask must be prepared for each new interconnection pattern and that, therefore, a large number of different part numbers must be handled in the manufacturing process. The advantage is that, in case of large volume per part numbers, the simple via reduces manufacturing costs over other methods and that the direct via does not introduce substantial series resistance.

Figure 7:
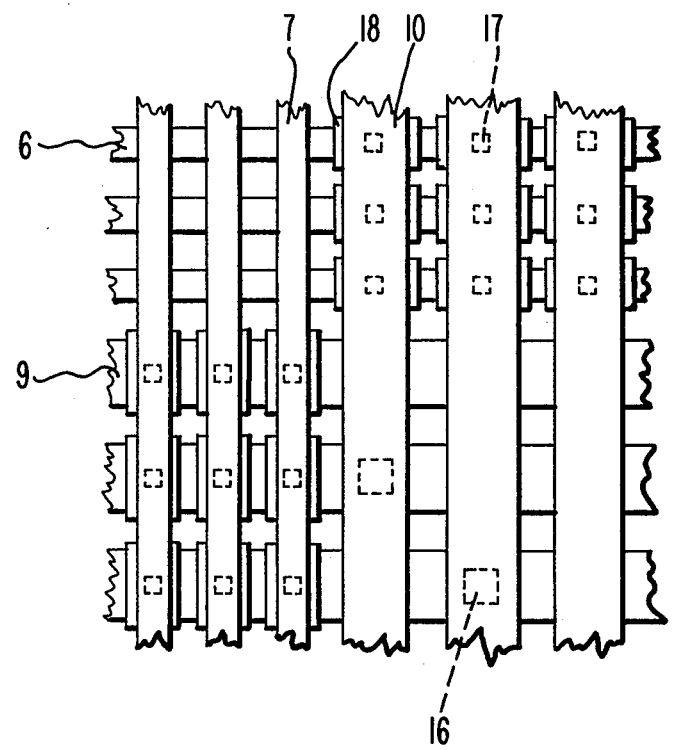
Figure 8:
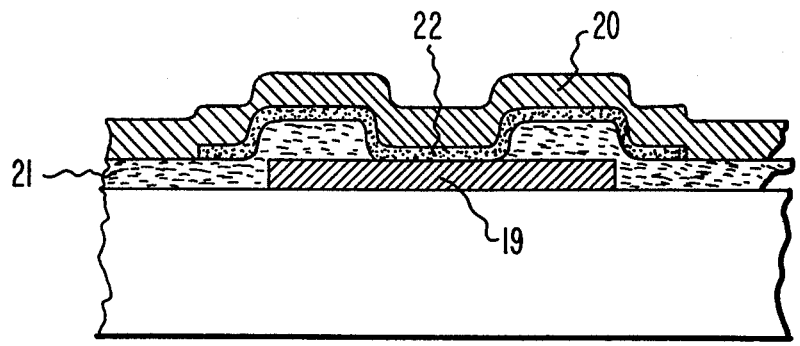
FIG. 8 shows a cross section through a cross-over between a pad line and a net line. Lower level metal (19) is generally separated from upper level metal (20) by the insulator (21) except for the via hole within the insulation where the metals are separated from each other by the amorphous semiconductor material (22).

The second method solves the individual mask and the part number problem by programming the desired interconnection electrically after the substrate has gone through the complete manufacturing process. In order to facilitate this programming, all cross-overs between pad lines and net lines have a permanent via (17) cut through the insulator between them, which is then covered up by a pad (18) of chalcogenide or amorphous semiconductor material as shown in FIGS. 7 and 8. Net lines (9, 10) are shown in FIG. 7 as the wider lines (20 μm), while pading lines (6, 7) are shown as the narrow lines (10 μm). The useful characteristic of the amorphous switch for this application is that it provides originally an insulator which can be transformed into a conductor (approximately 100Ω resistance per junction) if a voltage higher than a threshold voltage is applied. If the threshold voltage is set by design to be sufficiently higher than the operating voltages of the chips, accidental firing during later use is prevented. For intended firing, a voltage higher than the threshold voltage is applied by raising the potential of the applicable net line via the edge contact provided for each net and by lowering the potential of the applicable pad line via the pad. All other net lines are either tied to ground or kept floating, and all other pad lines are also either kept floating or tied indirectly to ground via an already fired cross-point and a net line. Thus, cross-points which are not to be fired are only exposed to about half of the total voltage or are isolated through a large series impedance. The total firing voltage must be chosen such that it is larger than the threshold voltage but smaller than twice the threshold voltage.

The pads (18) are shown in FIG. 7 and FIG. 8 only in those locations where they are needed for the intended function. For the convenience of processing and other considerations, however, the pad area can be extended. Particularly, all pads in a vertical column can be made as contiguous strips, running in parallel under the upper level metal lines. This configuration would still provide perfect insulation between all lines even if the amorphous material had some noticeable residual conductivity in the unfired state. A further step would be to extend the amorphous material as a sheet over the total substrate. Covering cross-overs which must not be switched is harmless because firing of the material is prevented by an insufficient firing voltage and by the series insulator (21).

Once a cross-point has been fired, the voltages of the now connected pad lines and net lines are forced to be more or less equal, which precludes further independent programming. Consequently, a net line can be tied to more than one pad line, but a pad line can only be tied to one net line. This restriction, however, does not interfere with the intended method of constructing nets as shown in FIG. 9.

For the mechanical aspects of programming, it is important to note that not all of the 1,536 bonding pads and the 288 or 432 contact pads need to be accessed simultaneously. Actually, accessing one bonding pad plus one contact pad at a time is sufficient. Practically, a compromise between serial mechanical accessing and electrical switching between pads accessed mechanically and in parallel will be chosen. Though the substrate in the preferred embodiment of the invention carries only the wiring and the amorphous switches, it is also part of this invention that access switching logic for net lines can be integrated into a silicon wafer used as a substrate, for instance within the signal access areas (4).

Figure 5:
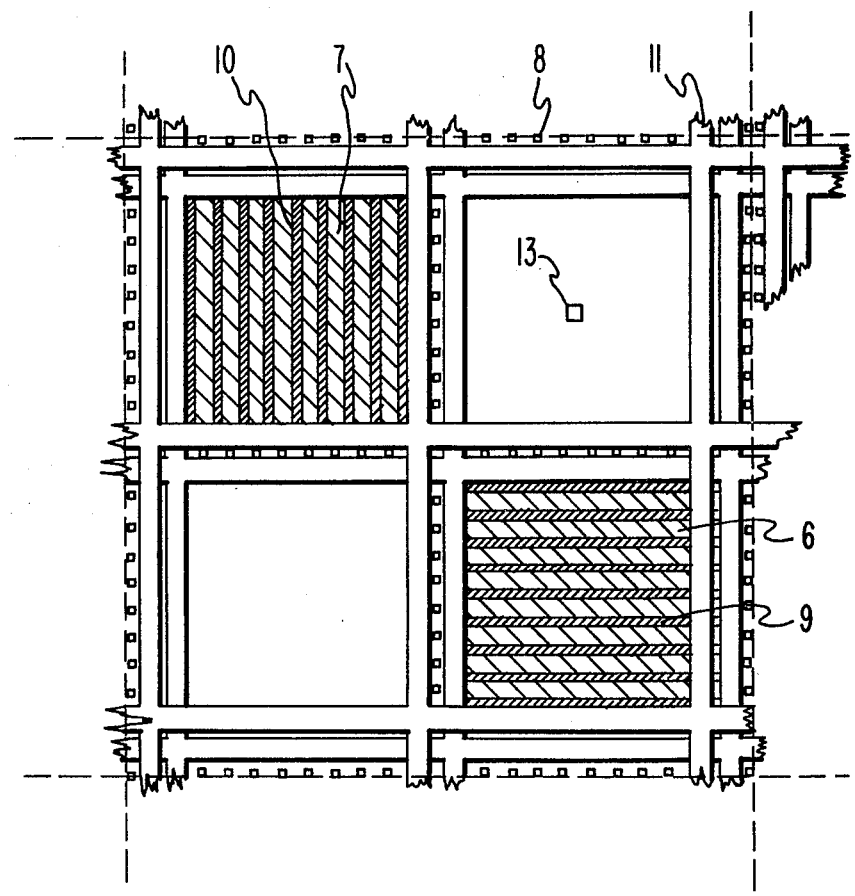
FIG. 5 shows an inner cell with some more detail. Power grid (11) bonding pads (8), pad lines (6 & 7), and net lines (9 & 10) share the available space in such a way that only two metal planes are needed and that no wires are found under a bonding pad.

Pads, pad lines, net lines, and power buses share the available space in the two metal layers as shown in FIG. 5. All pads (14, 15) are placed in the upper layer so that bonds can be made. The lower level space under the pads is not used because bonding may cause tiny cracks in the insulator which could lead to shorts with the lower layer metal. The power buses (11) are also part of the upper layer so that bonds can be made to it. An exception is the cross-over between two buses. Here, one bus dives through under the other bus. Net lines (9, 10) do not need to come to the surface except for the contact pads (27) in the contact areas (4). Horizontal net lines (9) may be placed into the lower layer as indicated in FIG. 7. They dive through under the power grids and avoid the bonding pads. Vertical net lines (10) may be placed in the upper layer. At the edge of the open fields between the power grids they have to dive to the lower layer so that they can also pass the grids. Note that the required lower level space is available because no other horizontal lines run under the power grids. Horizontal pad lines (6) run in the lower level just as the horizontal net lines (9) except that a via connection must be made to the bonding pads (14, 15). Note that the pad lines do not run under the bonding pads but rather in the space between them though lines and pads are in different layers. This is accomplished by fitting the pads between the lines as sketched in FIG. 2. The auxiliary pads (15) which have not been shown in FIG. 2 can be connected the same way because they are topologically adjacent to their respective main pads (14). The vertical pad lines (7) are placed together with their pads into the upper layer but must dive together with the vertical net lines in order to pass the horizontal power buses. The auxiliary pads (15) are connected to their respective pad lines through vias.

Outer cells have the same power grids but only one-half of the net and pad lines is shown in FIG. 2 and 3. Their wiring pattern is a direct subset of that used for inner cells.

Figure 12:
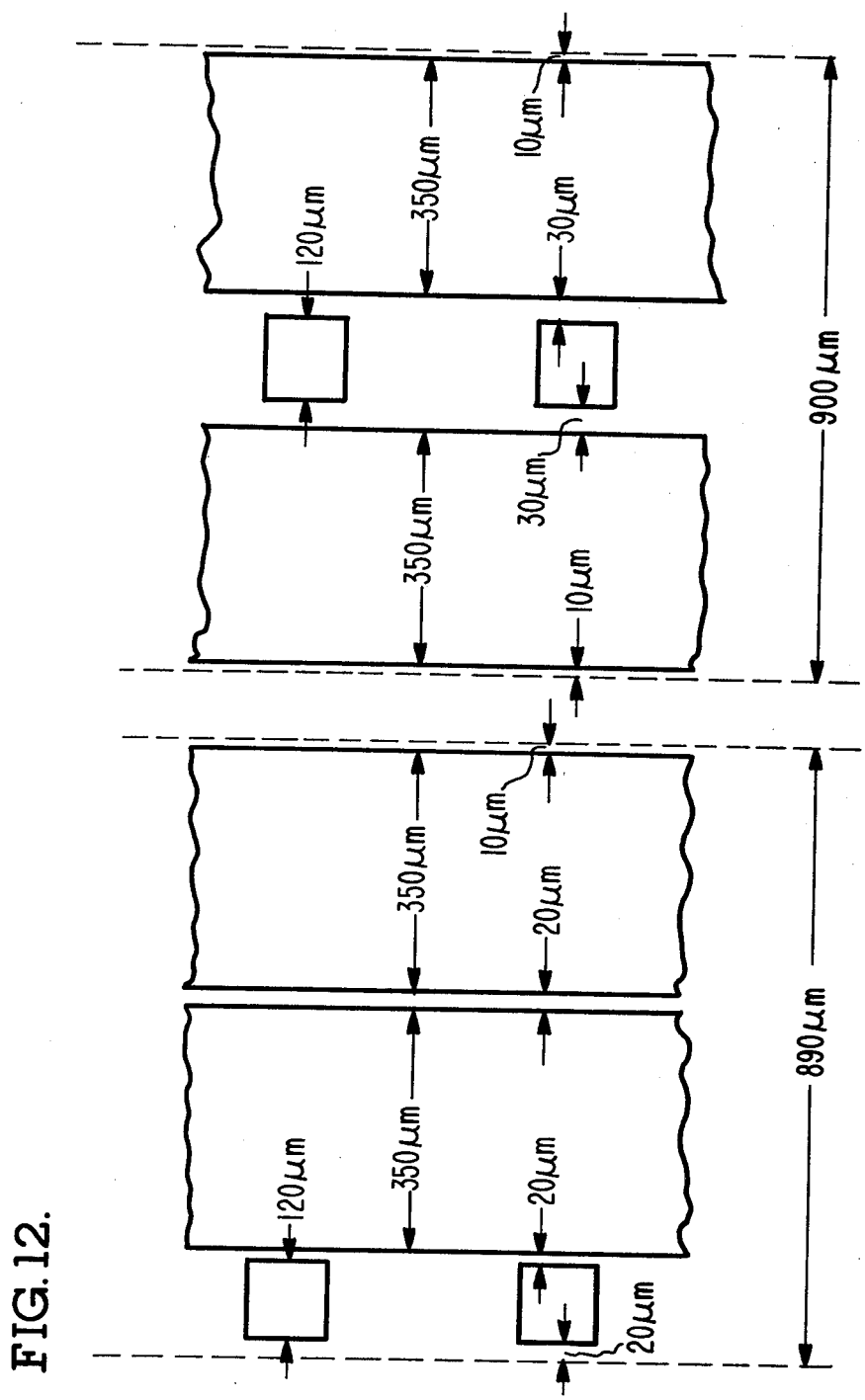
FIG. 12 shows how the strips containing the power buses and the bonding pads are layed out.

The space of a 9 mm cell may be allocated to the major areas as shown in FIG. 5: 0.89 mm each for the edge strips containing main bonding and two power buses, 0.9 mm for the center strip containing auxiliary pads and two power buses, and 3.16 mm each for the fields which contain each 8 pad line strips and 9 net line strips. The edge and center strips may be divided down further as shown in FIG. 12. A net line strip which is 120 μm wide can be used either for four 20 μm-lines and four 10 μm-spaces or for six 10 μm-lines and six 10μ/m-spaces. A pad line strip which is 260 μm wide can be used for one 120 μm pad, seven 10 μm-lines, and seven 10 μm spaces.

It has been shown that any desired interconnection pattern can be programmed. This flexibility can also be used to correct manufacturing defects. If spare pads and spare net lines are available, a given set of defects can be neutralized simply by not using any affected pads or nets. Since it is known that certain amorphous chalcogenide materials cannot only be switched into the conductive state but also back into the non-conductive state, the usage of such materials would not only allow for programming but also for reprogramming. Reprogramming can then be used to neutralize even such defects which are discovered or which occur only after the initial programming.

What is claimed is:

1. A substrate for integrated circuitry comprising a base substrate wafer adapted for integrated circuit processing having disposed thereon a first conductive interconnection layer of lines and a second conductive interconnection layer of lines and a layer of insulation separating said first and second interconnection layers, said base substrate being adapted for carrying a plurality of integrated circuit chips thereon, and said first and second interconnection layers being adapted to provide a passive bi-directional routing network capable of handling many independent and concurrent signals between said integrated circuit chips which are to be mounted on said substrate by a discretionary pattern of interconnection lines, said first and second interconnection layers being interconnected after fabrication of the substrate at discretionary cross-points through said insulating layer, each of which discretionary cross-points connects a line in said first interconnection layer with a line in said second interconnection layer to complete and fix the discretionary pattern of interconnection lines, each of said discretionary cross-points being formed by the application of a first potential to a single first line of said first interconnection layer and a second different potential to a single second line of said second interconnection layer which crosses said single first line at a selected discretionary cross-point, whereby the selected discretionary cross-point is created as a bi-directional conductive via by altering the state of the insulation at the cross-point from a dielectric state to a conductive state to set an interconnection between said single first line and said single second line at the selected discretionary cross-point to form at least a part of said discretionary pattern of interconnection lines for said integrated circuit chips.

2. A universal interconnection substrate for interconnecting integrated circuit chips, comprising
a wafer substrate,
a reticulate network deposited on said wafer substrate including a plurality of net lines aligned in a first direction and another plurality of net lines aligned in a second direction, said network having a plurality of network lines, each having a programming terminal, formed by having single ones of said net lines aligned in a first direction permanently connected to a corresponding net line of the lines aligned in a second direction enabling bi-directional current flow from the first net line to the second net line and from the second net line to the first net line, at least some of said network lines being disconnected from other elements formed on said substrate,
a plurality of pad lines, said pad lines crossing net lines but being normally insulated therefrom,
a plurality of bonding pads located on the surface of said substrate, said bonding pads being connected each to a single pad line,
a plurality of discretionary interconnection means for permitting discretionary interconnection of a first bonding pad through a selected network line to a second bonding pad each consisting of:
 (a) a first pad line which crosses a discretionary network line at a first point,
 (b) a second pad line which crosses said discretionary network line at a second point,
 (c) material alterable by a temporarily applied control voltgage material having a normally high impedance to insulate pad lines from net lines and yet being switchable to a state of low impedance;

the said material being altered to a state of low impedance so as to permit bi-directional conduction between said pad line and said second line through said network line,
a plurality of said discretionary means being provided which can have their material altered to form interconnections between different pads through a selected network line at various points on said substrate whereby a discretionary network is created after manufacture of the substrate by altering the material for interconnection of integrated circuits when they are connected to said pads according to a user desired interconnection of bonding pads.

3. A universal interconnection substrate adapted to interconnect via a passive bi-directional routing network the contact points of integrated circuit chips, comprising,
a support substrate having located thereon a plurality of contact points to which integrated circuit chips may be coupled,
said support substrate including a reticulate array of a plurality of network conductors each having a firing point adapted for interconnection to said contact points and permitting when fired the flow of a plurality of independent, concurrent signals through said network;
a plurality of pad lines leading from their associated contact points across said reticulate array,
means for permitting discretionary interconnection by programmatically interconnecting, after fabrication of the universal interconnection substrate and without latches for the interconnection, discretionarily selected pad lines to one another to form a bi-directional routing network therebetween through a selected one of said network conductors of said reticulate array by providing a switched path at its firing point between a pad line and said one selected network conductor and between at least one other pad line and said one selected network conductor at its firing point of said reticulate array.

4. A universal interconnection substrate for interconnecting a plurality of integrated circuit chips which are to be mounted on the substrate, the substrate comprising,
a wafer substrate having formed thereon a plurality of net conductors in a reticulate array network of similar net conductors which when interconnected to integrated circuits mounted on said substrate for a bi-directional routing network for the many concurrent chip-to-chip signals traveling through said network,
means for defining which of the similar net conductors of the reticulate array network carry signals for which chips,
said defining means including a plurality of contact pads for chips located on the surface of said substrate at spaced distances which permit a bonding of a great variety of different sized and/or function chips to be bonded to said pads and associated pad lines for each contact pad traveling across the network, and programmable semiconductor material switchable to a low impedance between a pad line and a single one of the associated net conductors of the network and between another pad line and said single one of the associated net conductors of the networks whereby communication between pad lines is made through the reticulate array network by the net conductor which has a switched interconnection of the pad lines and selected associated net conductors.

5. A universal interconnection substrate for interconnecting a plurality of integrated circuit chips which are to be mounted on the substrate according to claim 4, wherein said programmable semiconductor material is a material of high normal impedance and normally acts as an insulator between pad lines and conductors of said array, but at the points of desired contact of a pad line with the array is switched after manufacture of the substrate and before bonding of chips to be a material of low impedance by creating a voltage differential across the specific desired contact which surpasses the threshold of said semiconductor material.

6. A univeral interconnection substrate according to claim 4, wherein said programmable semiconductor material is an amorphous chalcogenide material which is normally non-conductive but which can be switched into the conductive state by providing an electrical signal to both a selected pad line and a selected net line to cause a conductive via to be formed at a crossing of the selected pad and selected net line.

7. A universal interconnection substrate according to claim 4, wherein said reticulate array of net conductors has a first plurality of net lines deposited on the substrate traveling in a first direction and a second plurality of net lines deposited on the substrate traveling in a second direction, each of the lines of the first direction being permanently connected through a mask formed permanent via to at least a corresponding one of the lines traveling in a second direction to form a first of a plurality of possible networks, the connection of pad lines to their associated one of the net lines by programmably switching said semiconductor material to form a conductive via, one pad line to one net conductor, defining the desired and discretionary interconnection through the network of interconnected lines which are connected to different contact pads.

8. A universal interconnection substrate according to claim 4, wherein power distribution means are provided on the insulation layer of the substrate which carries the reticulate array of conductors, and the surface of the said substrate is defined by areas of inner cells in which some said contact pads are located, outer cells in which some said contact pads are located, logic line hook-up areas which to an external logic line may be connected and power hook-up areas, and in which said inner cells and outer cells are provided with conductive lines traveling across the cells for power distribution to chips being provided via said power hook-up areas.

9. A hybrid circuit formed in combination with a universal interconnection substrate, the combination comprising,
a universal interconnection support substrate including:
a silicon wafer support substrate element having formed thereon a conductive grounding layer; and also having thereon an insulation layer carrying in two layers a reticulate array of conductors;
said reticulate array of conductors having a first plurality of logic net lines and a second plurality of logic net lines arranged in substantially parallel but orthogonal directions on said insulation layer and having points of interconnection at crossing points between lines of said first and second plurality of logic net lines,
a plurality of contact pads on the surface of said substrate with pad lines being connected to each of the contact pads, said pad lines crossing said array of conductors at a plurality of points but each being programmatically connected to only one associated logic net line if connected at all by a switching of programmable semiconductor material at the desired point of connection by the application of an electrical voltage differential between the selected one of said pad lines and the selected associated logic net line to cause a current to pass across the said material at a cross-point of said pad line and selected net line to achieve switching the said semiconductor material located between the pad line and its selected associated logic net line to a state of low impedance, thereby defining a bi-directional routing connection for signals between selected contact pads on the surface of the said substrate and its associated logic line, and a like pad to logic line connection being formed to complete a pad through logic line to pad connection,
power distribution means having power hook-up areas across the surface of said substrate and including power hook-up pads located on the surface of the substrate, and
integrated circuits of different functions located on the surface of said substrate and having their bonding pads connected to the said contact pads on the surface of said substrate, the routing network between chips being defined after manufacture of said universal interconnection support substrate.

10. An interconnection substrate on which integrated circuits are to be interconnected comprising
(a) a substrate for supporting an interconnection pattern of lines fabricated to have a plurality of possible different lines for use in said interconnection pattern lines
(b) said possible different lines including a plurality of network lines, each having a terminal point for possible signal connection to circuits outside of the network, extending vertically and horizontally across the substrate
(c) a plurality of pad lines each extending either vertically or horizontally across the substrate and across at least some of the network lines but being normally insulated therefrom, and each pad line having a bonding pad for connection to another element,
(d) switchable dielectric material between pad lines and network lines at least at cross-points therebetween,
(e) pad to network line connection means being formed by programming a passive discretionary conductive via pattern through said switchable dielectric material which selects the specific ones of said possible different lines for use in a desired interconnection pattern of lines formed after fabrication of the network lines, pad lines and bonding pads, and switchable material on said substrate, said pad to network line connector means defining the specific pads and specific network lines which interconnect the chips which are to be mounted on the substrate for concurrent bi-directional routing of signals between integrated circuits which are to be interconnected on said substrate.

11. An interconnection substrate for interconnecting a plurality of integrated circuits on said substrate to form an interconnected system, comprising a base substrate
electrically programmable interconnection network means formed on said base substrate,
said interconnection means including
(a) an array of separate net lines disposed on said substrate, each net line having a programming terminal located at the periphery of the substrate,
(b) an array of bonding pads disposed about the area of the base substrate which are adapted to be connected to bonding elements of integrated circuits,
(c) a plurality of individual pad lines, disposed across the base substrate each being conneccted to a single bonding pad such that each bonding pad has a single associated pad line, each of the pad lines crossing net lines at a cross-point which cross-point is a programmable or switchable material,
(d) said programmable or switchable material being normally a dielectric in the virgin unprogrammed state but switchable by programming to be a bi-directional conductor; said material being located at the cross-points between pad lines and net lines; and said electrically programmable interconnection network means being formed by the application of a voltage differential between a single net line and a single pad line to cause the formation of a conductive path between the single net line and single pad line,
(e) permanently insulated cross-overs at all cross-points other than those between a selectable net line and a selectable pad line, so that needed interconnection patterns to interconnect a set of integrated circuits for a specific purpose can be formed by successive voltage applications between sets of a selectable pad line and a selectable net line to form the said bi-directional conductor without interference from other previously formed bi-directional conductors,
(f) input/output terminals for the interconnected system being a subset of said programming terminals.

12. An interconnection substrate according to claim 11 wherein
the programming terminal of a net line is located at the periphery of the substrate.

13. An interconnection substrate according to claim 11 wherein
some of the programming terminals of net line serve as input/output ports for the system formed by interconnected chips.

14. An interconnection substrate according to claim 11 wherein
chip bonding pads are distributed in a regular pattern across the substrate and programming terminals are distributed in a regular pattern about the periphery of the substrate.

15. An interconnection substrate according to claim 11 wherein
programmable or switchable material between a net line and a pad line has a defined threshold voltage switching level, and that in order to switch a selected specific pad line to net line interconnection a voltage differential is applied to several net line and pad line crossing-points but only the selected specific pad line to net line interconnection receives a control voltage which surpasses the threshold voltage to cause the selected interconnection to become a bi-directional conductive via.

16. An interconnection substrate according to claim 11 wherein
once a bi-directional conductive via between a specific pad line and net line has been formed that specific pad line can only be connected to that specific net line, but a net line can be tied to more than one pad line.

17. An interconnection substrate according to claim 11 wherein
there is provided a two rail power distribution matrix wherein a possible integrated circuit bonding area of the substrate is crossed by both rails, each power rail being connected to a pair of contact pads in a power hookup area.

18. An interconnection substrate according to claim 11 wherein
two power rails for the integrated circuits pass along the edges and along the center lines of a possible integrated circuit bonding area of the substrate.

19. An interconnection substrate according to claim 11 wherein
a discretionally selected cross-point between a net line and a pad line is formed as a bi-directional conductive via by applying a voltage higher than the threshold voltage of the programmable or switchable material at the cross-point by applying a first potential to the applicable net line at a contact provided therefor, and a second different potential to the applicable pad line via a bonding pad while all other net lines are either grounded or kept floating or tied indirectly to ground via an already fired cross-point and a net line, such that cross-points which are not to be fired are exposed to a reduced voltage or are isolated through a large series impedance, the total voltage applied across the selected cross point being larger than the threshold voltage of the programmable or switchable material but smaller than twice the threshold voltage.

20. An interconnection substrate according to claim 11 wherein
the programmable or switchable material at a cross-point vias between net lines and pad lines all conduct a small leakage current in the dielectric state, yet a specific selected net line to pad line bi-directionally highly conductive programmable via can be formed by applying a first voltage differential pulse to a net line and a second voltage differential pulse to a pad line to cause the voltage at the cross-point between the specific selected net line to pad line to surpass the semiconductor material's threshold voltage and thereby form a bi-directionally highly conductive via while unselected cross-point vias do not surpass the threshold voltage and thereby remain in a highly resistive state.

* * * * *